United States Patent
Akopyan et al.

(10) Patent No.: US 7,466,258 B1
(45) Date of Patent: Dec. 16, 2008

(54) ASYNCHRONOUS ANALOG-TO-DIGITAL CONVERTER AND METHOD

(75) Inventors: Filipp Akopyan, Ithaca, NY (US); Alyssa Apsel, Ithaca, NY (US); Rajit Manohar, Ithaca, NY (US)

(73) Assignee: Cornell Research Foundation, INc., Ithaca, NY (US)

( * ) Notice: Subject to any disclaimer, the term of this patent is extended or adjusted under 35 U.S.C. 154(b) by 0 days.

(21) Appl. No.: 11/545,228

(22) Filed: Oct. 10, 2006

Related U.S. Application Data

(60) Provisional application No. 60/725,165, filed on Oct. 7, 2005.

(51) Int. Cl.
*H03M 1/12* (2006.01)
(52) U.S. Cl. .......................... 341/155; 341/159
(58) Field of Classification Search .................. 341/155, 341/159
See application file for complete search history.

(56) References Cited

U.S. PATENT DOCUMENTS

| | | | | |
|---|---|---|---|---|
| 5,296,856 A * | 3/1994 | Mantong | .................... | 341/139 |
| 6,404,372 B1 * | 6/2002 | Heithoff | ..................... | 341/155 |
| 6,492,929 B1 * | 12/2002 | Coffey et al. | ............... | 341/155 |
| 6,798,188 B2 * | 9/2004 | Dathe et al. | .............. | 324/103 P |
| 6,850,180 B2 * | 2/2005 | Hales | ......................... | 341/162 |

* cited by examiner

*Primary Examiner*—Khai M Nguyen
(74) *Attorney, Agent, or Firm*—Burns & Levinson LLP; Jacob N. Erlich, Esq.; David W. Gomes, Esq.

(57) ABSTRACT

A method and apparatus for converting an analog input signal to a digital output signal, provide for simultaneously comparing the input signal to a sequential multiplicity of reference values representing a range of values of the input signal, and asynchronously processing digital results from simultaneous comparison to produce a digital representation of level crossings of the input signal with respect to the multiplicity of reference values.

20 Claims, 9 Drawing Sheets

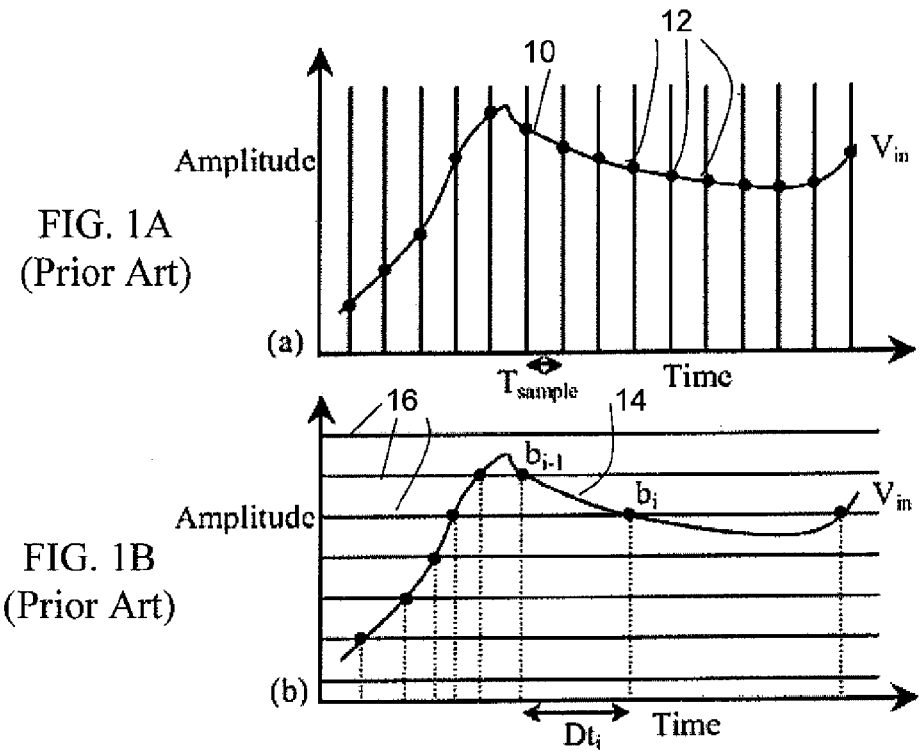
FIG. 1A
(Prior Art)
FIG. 1B
(Prior Art)
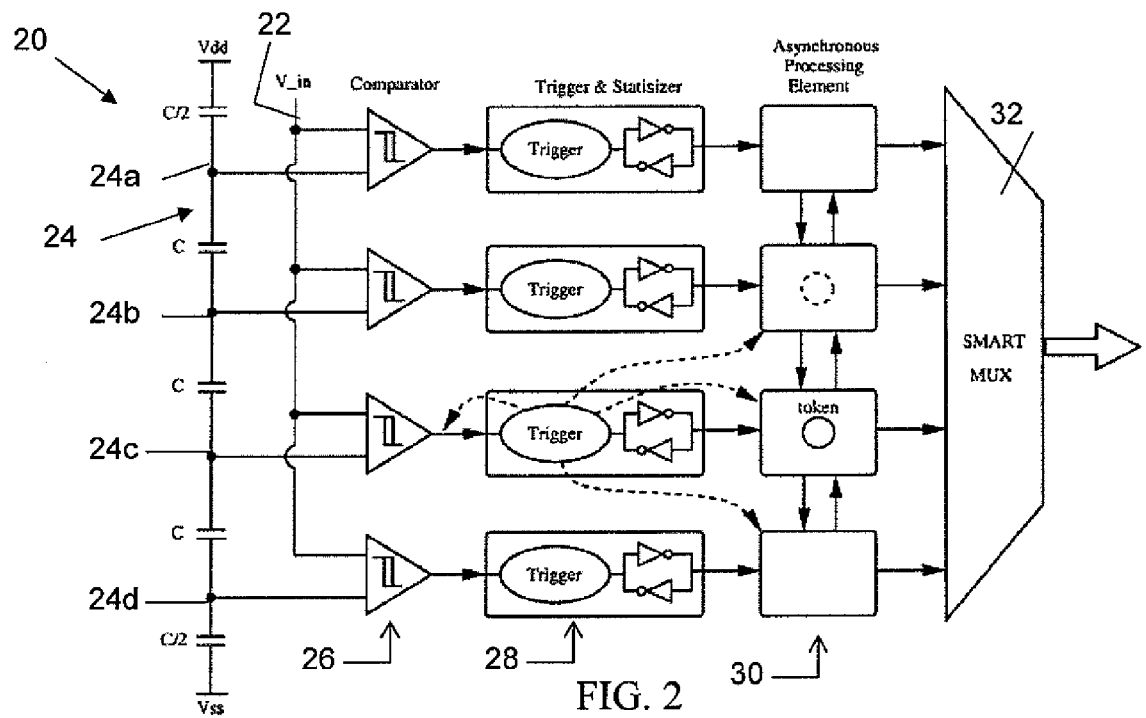
FIG. 2

Program 3.1 CHP: ASYNC-ADC, One Processing Element

MAIN_PROCESS ≡

*[ [ $\overline{A}$ → TOKEN_CHECK_PROCESS: t↑; E!(¬k); k := ¬k; A

[] $\overline{D}$ → D; t↓; k↓

[] $\overline{U}$ → U; t↓; k↑
]]

TOKEN CHECK PROCESS ≡

*[ [¬t → [k → U_next [] ¬k → D_previous]

[] t → skip

]]

Program 3.2 HSE: ASYNC-ADC, One Processing Element

MAIN_PROCESS =

*[ [

$y.d \wedge \neg t \wedge k\ t \rightarrow$  u_n.d↑ ; [u_n.a]; y.a ↑ ; [ ¬y.d]; u_n.d↓ ;

[¬u_n.a]; y.a↓

$y.d \wedge \neg t \wedge k \rightarrow$  d_n.d↑ ; [d_n.a]; y.a↑ ; [¬y.d]: d_n.d↓ ;

[ ¬d_n.a]; y.a↓

$y.d \wedge t \rightarrow$  y.a↑ ; [¬y.d]; y.a↓

] ]

TOKEN_CHECK_PROCESS =

*[ [

$\neg e.a \wedge a\_l\_d \rightarrow$  [kt → v.t↑ [] kf → v.f↑ ]; y.d↑ ; [y.a];

[v.t → kt↓], kf↑ ; e.f↑ [] v.f → kt↑, kf↓; e.t↑ ];

a_l.a ; [ ¬a_l.d ∧ e.a]; v.t↓ ; v.f↓ ; y.d↓; [ ¬y.a];

t↑; e.t↓ , e.f ↓; a_l.a↓ u_l.d  $\rightarrow$  kf↓, kt↑; u_l.a↑; t↓; [¬u.l.d]; u_l.a↓ d_l.d  $\rightarrow$  kf↑, kt↓; d_l.a↑; t↓; [¬d_l.d]; d_l.a↓

ASYNCHRONOUS ANALOG-TO-DIGITAL CONVERTER AND METHOD

CROSS REFERENCE TO RELATED APPLICATIONS

The present application claims priority from U.S. Provisional Patent Application Ser. No. 60/725,165, filed Oct. 7, 2005, entitled Asynchronous Analog-To-Digital Converter, the contents of which are hereby incorporated herein

STATEMENT REGARDING FEDERALLY SPONSORED RESEARCH OR DEVELOPMENT

This invention was made partially with U.S. Government support from the National Science Foundation under grant numbers 0428427 and 0435190. The U.S. Government has certain rights in the invention.

BACKGROUND OF THE INVENTION

Prior analog to digital conversion techniques have used various methods. FIG. 1A represents a typical periodic sampling technique where an analog signal 10 is sampled every $T_{sample}$, so that the sampled values 12 may then be converted to a digital representation. FIG. 1B represents an alternative level-crossing technique where an input signal 14 is compared to a multiplicity of reference values 16, and the time periods, Dti, between reference level crossings of input signal 14 are recorded along with the specific level crossings.

SUMMARY OF THE INVENTION

In one embodiment of the present invention, an analog to digital converter for digitally representing the value of an input signal, comprise asynchronous circuitry adapted for digitally indicating the value of the input signal in response to level crossings between the input signal and a multiplicity of sequential reference values representing a range of values for the input signal.

The converter may further comprise reference circuitry adapted for providing the multiplicity of reference values, and a separate comparator representing each different reference level and coupled to receive its respective reference level at a first input thereof, wherein each comparator includes a second input coupled to receive the input signal.

The converter may further comprise a separate processing circuit coupled to an output of each comparator and adapted for using output signals from each respective comparator to provide a digital representation of level crossings between the input signal and each respective reference value. Each processing circuit may include a separate trigger circuit coupled to an output of its respective comparator and adapted to capture changes in the respective comparator output indicating a respective level crossing between the input signal and the respective reference value.

Each processing circuit may be adapted to determine if a change in a respective comparator output is a valid level crossing before providing a digital representation of a level crossing. Each processing circuit may be adapted to store a logical indicator or token in response to a valid level crossing being determined for its respective comparator output.

Each processing circuit may be adapted to respond to a present signal from its respective trigger circuit indicating a respective present level crossing, to determine if an immediately previous valid level crossing was determined in either the present processing circuit or in processing circuits for respective reference levels located immediately above and below the present respective reference level. Each processing circuit may be adapted to respond to a present signal from its respective trigger circuit indicating a respective present level crossing, by looking for the logical indicator or token first in the present processing circuit and then in processing circuits for respective reference levels located immediately above and below the present perspective reference level.

Each processing circuit may be adapted to process a present signal from its respective trigger circuit indicating a respective present level crossing as a valid level crossing and output a digital signal representing the level crossing indicated by the respective trigger circuit if an immediately previous valid level crossing was determined in either the present processing circuit or in processing circuits for respective reference levels located immediately above and below the present respective reference level.

The converter may further comprise control circuitry coupled to said processing circuitry for providing power to only two comparators representing adjacent reference values immediately above and below a current value of the input signal.

The asynchronous circuit may only provide digital output signals in response to changes in the input signal. The asynchronous circuit may only provide digital output signals in response to relative changes between the input signal and each of the reference values.

The reference circuitry may be a capacitive voltage divider. The comparators may exhibit hysteresis.

In another embodiment of the present invention, a method for converting an analog input signal to a digital output signal, comprises the steps of simultaneously comparing the input signal to a sequential multiplicity of reference values representing a range of values of the input signal, and asynchronously processing digital results from the step of simultaneously comparing to produce a digital representation of level crossings of the input signal with respect to the multiplicity of reference values.

The step of simultaneously comparing may be performed using a separate comparator representing each reference level, and the method may further comprise the step of capturing an output signal from each comparator indicating a respective level crossing between the input signal and the respective reference value, for enabling the step of asynchronously processing. The step of asynchronously processing may be substantially performed by separate logic circuitry respective of each reference level and respective comparator.

The step of asynchronously processing may include storing a variable indicating which reference level was last crossed by the input signal and whether the input signal is either above or below that last crossed reference level. The method may further comprise the step of providing power to only two separate comparators representing reference levels above and below the current input signal value.

The step of asynchronously processing may include the step of determining if a change in a respective comparator output is a valid level crossing before producing a digital representation of that level crossing. The step of asynchronously processing may include the step of determining whether the input signal has crossed a respective reference level from below or from above.

BRIEF DESCRIPTION OF THE DRAWINGS

Embodiments of the present invention are illustratively described in reference to the appended drawings in which:

FIGS. 1A and 1B are graphical representations of two prior art analog-to-digital conversion techniques;

FIG. 2 is a block schematic diagram of an analog-to-digital converter constructed in accordance with one embodiment of the present invention;

FIG. 10 is a flow chart of a logical handshake process executed by the processing element of FIG. 7;

DETAILED DESCRIPTION OF THE INVENTION

Figure 3:
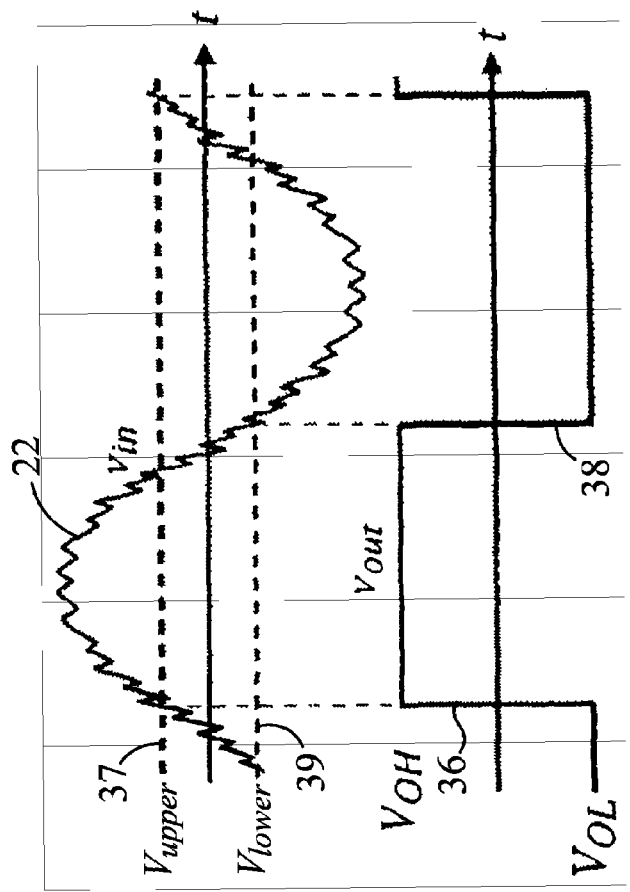
FIG. 3 is a graphical representation of the operation of a comparator having hysteresis.

FIG. 2 shows a block diagram of an asynchronous analog-to-digital converter 20 adapted to digitally represent the value of an input signal 22 in response to level-crossing signals produced by comparing input signal 22 to a multiplicity of sequential reference values which cover a range of values for input signal 22. Circuit 20 generally includes a voltage divider network 24, a multiplicity of comparators 26, a multiplicity of trigger circuits 28, asynchronous processing circuitry 30 and a multiplexer 32.

Voltage divider 24 is used to set the reference levels. The analog comparators 26 detect whether the input signal 22 is above or below the respective reference levels. The output of each comparator 26 is connected to a digital trigger 28. The trigger checks the state of the two neighboring asynchronous processing elements 30 to determine whether the reference level was crossed or not. If the crossing condition is true, the trigger sends a request to the asynchronous circuitry 30 to process the obtained sample. After processing the sample, the asynchronous element 30 outputs to the multiplexer 32 whether the level was crossed up or down. The multiplexer merges all the outputs into a single channel. Multiplexer 32 uses serial data transfer for the purpose of minimizing the number of wires that have to connect to converter 20. The output represents the increment of the input signal from the previous sample and not the complete n-bit sample. This scheme decreases the bandwidth required to send the output and is advantageous from the standpoint of data compression.

Voltage divider circuit 24 provides a sequential multiplicity of voltages each representing a different sequential reference value 24a-24d for comparison against input signal 22. The multiplicity of comparators 26 includes a separate comparator 26a-26d representing a separate one of the multiplicity of reference values 24a-24d. Comparators 26a-26d each includes a first input terminal 26e coupled to receive its respective reference value and a second input 26f coupled to receive input signal 22.

The multiplicity of trigger circuits 28 includes a separate trigger circuit 28a-28d coupled to the output of each comparator 26a-26d for capturing respective output signals from comparators 26a-26d representing relative level crossings between input signal 22 and the respective reference levels 24a-24d. Asynchronous processing circuitry 30 includes a separate processing element 30a-30d coupled to each trigger circuit 28a-28d and adapted for determining the validity of a level crossing indicated by the respective trigger circuit 28a-28d and for outputting a digital representation of valid level crossings through multiplexer 32.

Voltage divider 24 provides reference voltages to the gates of transistors in comparators 26a-26d and thus, the reference voltages draw negligible amounts of current from divider 24. This allows use of a capacitive divider in the present embodiment, instead of a resistive divider. Ideally, a capacitive divider draws no current from the voltage supply. However, some current leaks through the capacitor plates. If necessary, the levels on divider 24 can be periodically reset by nullifying the charge at those nodes. This can be done by having NMOS transistors with their drains tied to the reference nodes and their sources tied to ground. On RESET, the transistors are turned on, thus, no charge is retained on the capacitor plates. If more accurate reference levels are desired, then large resistors (for minimal amount of current flow) can be used instead. Such resistors may be implemented as a transistor in triode region, or as a transistor with its gate as one end of the resistor and its source tied together with its drain as the other end of the resistor. Both of these techniques minimize the occupied circuit area.

Comparators 26a-26d perform comparisons between the instantaneous value of input signal 22 and reference levels 24a-24d, producing a logic output level depending on the result of the comparison. It is preferable to use a low-power comparator that is able to suppress a noisy input signal so that the samples are not taken when the input is fluctuating around the reference level. The comparator should have sufficient bandwidth to operate at least at 10 MHz higher than the maximum frequency of the input signal.

The comparator is used to convert a slowly changing input signal into digital logic levels with sharp edges. If the environment where the comparison is used is noisy, meaning the signal is fluctuating, or if the noise from the rest of the circuit is high, several problems can arise. If the response time of the comparator is faster than the variation of the input signal around the threshold level, the output can chatter between 'high' and 'low' logic values as the input crosses the threshold. This output variation, which can be problematic for digital design, can be eliminated by employing positive feedback that forces a comparator to behave as a regenerative latch. In this case, the comparator will exhibit hysteresis. The performance of such a regenerative latch is graphically represented in FIG. 3 wherein the effect of a noisy input signal on a comparator is negated by hysteresis. A positive transition 36 of the comparator output $V_{OH}$ only takes place when input signal 22 crosses $V_{upper}$ 37, and a negative transition 38 of the comparator output $V_{OL}$ only takes place when input signal 22 crosses $V_{lower}$ 39.

Figure 4:
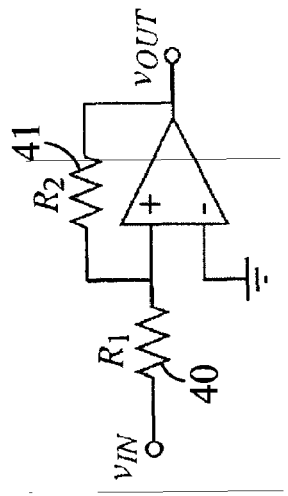
FIG. 4 is a circuit diagram of a Schmitt trigger.

A regenerative comparator is commonly called a Schmitt trigger, such as that shown in FIG. 4. The trip points, or values of input voltage that force a switch in the state of the output, are given by:

$$V_{lower} = -\frac{R_1}{R_2} V_{OH}$$

$$V_{upper} = -\frac{R_1}{R_2} V_{OL}.$$

a

Figure 5:
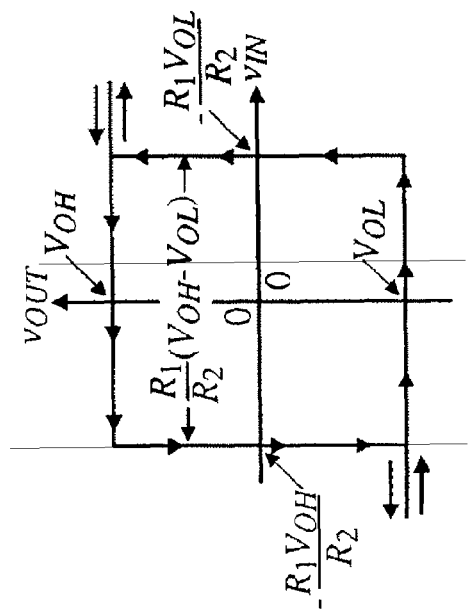
FIG. 5 is a graphical representation of a Schmitt trigger response.

The above mathematical expressions are graphically represented in FIG. 5, which shows the upper and lower trip points of the trigger. The use of a Schmitt trigger may be desirable in applications which require high precision and where the trip points, $V_{upper}$ and $V_{lower}$, are easily modified by changing the values of R1 40 and R2 41 (FIG. 4). The circuit also has very high differential gain providing sharper output edges and a high bandwidth.

Figure 6:
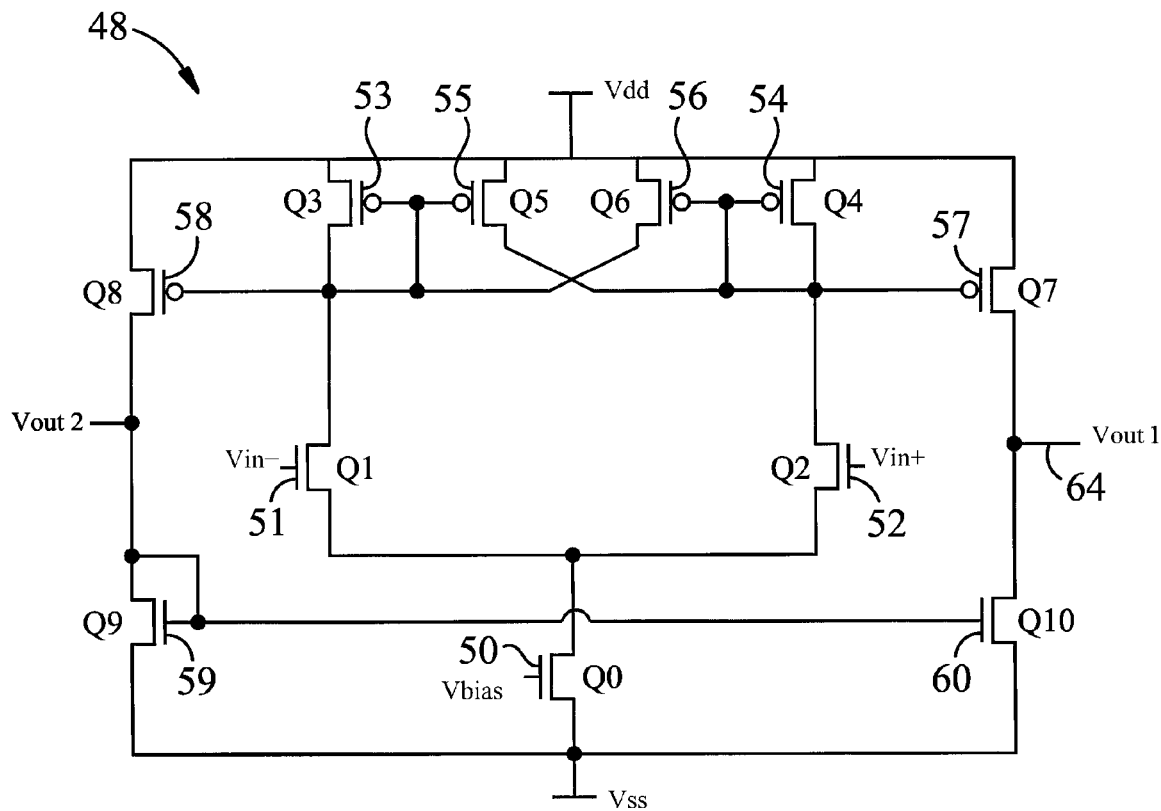
FIG. 6 is a schematic diagram of a semiconductor differential regenerative comparator.

Another approach uses a differential comparator 48 as shown in FIG. 6 to provide simplification, a smaller layout area and lower power consumption. The differential topology of FIG. 6 uses only 11 transistors, and no resistors. The design is based on the differential pair Q1 51 and Q2 52, the bias transistor Q0 50, load devices Q3 53 and Q4 54, and the cross-coupled pair Q5 55 and Q6 56. The only purpose of the current mirror and transistors Q7 57, Q8 58, Q9 59, Q10 60 is to provide additional gain for sharper output edges and to convert the differential output to the single-ended output. The bias transistor Q0 50 sets the current flowing through the circuit. The higher the current, the more power is consumed and higher bandwidth may be achieved. Power consumption can be traded off for bandwidth of the comparator depending on the application. Q3 53 and Q4 54 set the gain of the first stage: the larger the load devices, the higher the gain is and the more parasitic capacitance is introduced by these devices. Q5 55 and Q6 56 determine the amount of hysteresis and provide positive feedback for the comparator.

High precision operation can be achieved if the transistors are properly matched. The bandwidth of the comparator, as mentioned before, may be easily improved by increasing the bias voltage at the gate of Q0 50 at the cost of increased power consumption. The trip points of the circuit are mainly determined by the ratio of Q5 55 to Q3 53 (Q6 56 to Q4 54 have to be matched). The differential gain is large due to relatively high output resistance of the circuit. Since the load devices (Q3 53 and Q4 54) are implemented as diode-connected transistors and not as resistors, some non-linearity will inevitably be introduced. These nonlinearities are not as crucial in this analysis, because the circuit is used as a comparator and not as an amplifier.

The complete analysis of the regenerative comparator 48 is conventional and presented in Roubik Gregorian's book, *Introduction to CMOS Op-Amps and Comparators*. John Wiley & Sons, 1999). The formulas that determine the trip points of the comparators should be noted, since these values specify the amount of hysteresis present in the circuit. Assuming that one of the inputs, say the gate of Q1 51, is grounded and the gate of Q2 52 is connected to a negative potential much less than zero. In this situation Q2 52 is off, Q1 51 is on and all the tail current flows through Q1 51 and Q3 53. The currents through Q2 52, Q4 54, Q5 55 and Q6 56 are zero and, thus $V_{out}1$ 64 is high and $V_{out}2$ 65 is low. We then start to increase the voltage at the gate of Q2 52, the transistor starts conducting gradually and some of the tail current flows through it. This process continues until the currents through Q2 52 and Q5 55 are equal. At this point, if the voltage at the gate of Q2 52 is increased any further, the comparator will switch the state of its output. That would lead to Q1 51 turning off and all of the tail current flowing through Q2 52. This analysis leads to the calculation of the upper trip point. To obtain the trip value, the currents through Q2 52 and Q5 55 are equated, VGATE of Q2 is then calculated by utilizing the transistor current equation. The same exact analysis with the gate of Q2 above the ground level (and decreasing towards ground) is applied to calculate the lower trip point of the comparator. If we label the currents through Q1 and Q2, as i1 and i2 respectively and their sum as i0, it can be shown that at the switching point:

$$V_{trig+} = \sqrt{\frac{i_o}{K'(W/L)_1}} \cdot \frac{\sqrt{\alpha}-1}{\sqrt{1+\alpha}}$$

$$V_{trig-} = \sqrt{\frac{i_o}{K'(W/L)_1}} \cdot \frac{1-\sqrt{\alpha}}{\sqrt{1+\alpha}}$$

$$\alpha = \frac{(W/L)_6}{(W/L)_3} = \frac{(W/L)_8}{(W/L)_4}$$

$$K' = \frac{1}{2} \cdot \mu_o \times C_{ox}.$$

a

In these formulas,
a. W/L—transistor width-to-length ratio
b. Cox—oxide capacitance
c. μ—mobility of electrons or holes (depending on the transistor type)
d. —positive feedback factor As one can see from the above formulas, the hysteresis is mostly a function of the ratio of the sizes of the cross-coupled transistors to the load transistors, as well as the size of the input transistors. In order to obtain regenerative behavior the value of CY has to be greater than 1. In this embodiment, CY was set to the value of approximately 1.33 to obtain a region around the reference voltage that rejects noise in the input signal of the comparator and transistor matching (precision). Transistors are preferably chosen to be several times bigger than the minimal size transistors to obtain the necessary bandwidth and to provide reliable matching.

The positive voltage supply used in the circuit is 1.8 V and the negative voltage supply has to be set to −400 mV in order to obtain the full range of 1.8 V at the input of the comparators and have voltages down to 0 Volts as reference levels. Otherwise, if the negative voltage supply is just GND, then the lowest value that the comparator can recognize as a reference voltage is approximately 400 mV, which limits the input range of the converter.

The transistor sizes were not chosen to be minimal to improve matching and decrease the nonlinearities of the circuit. However, large transistors cannot be used, because they introduce large parasitic capacitances which limit the bandwidth of the circuit. There is a tradeoff between the bandwidth of the comparator and transistor matching, or precision. Transistors were chosen to be several times bigger than the minimal size transistors to obtain the necessary bandwidth and to provide reliable matching. In one embodiment, the maximum calculated attainable bandwidth is 16 MHz., which can be easily increased by applying a higher bias voltage at the gate of Q0 50.

A current transient simulation was used to calculate power consumption of the circuit at a given bias voltage. The average power consumption estimated for the period of 1 ms was 19.8 µW (the RMS value of current is 9 µAmps). In an embodiment where only two of the comparators have to be on at a time, the total simulated static power consumption of the analog part would be approximately 39.6 µW. The power consumption of the comparator varies from tens of nano-Watts to tens of micro-Watts depending on the chosen comparator bandwidth (i.e. the lower the bandwidth, the smaller the power consumption of the comparator).

In one simulation with the comparator working at a low bias voltage, the current plot contains a lot of high-amplitude ripples. Ripples indicate that further decrease in the bias voltage would result in the improper operation of the circuit, which was verified by reducing the bias voltage to approximately −200 mV. Parasitic charge build-up at internal nodes is responsible for the large-swing current ripples. The ripples can be eliminated by increasing the bias voltage of the circuit at the expense of increased power consumption. The current ripples are not likely a problem, since the circuit operates correctly as verified through the simulations and theoretical analysis. The current through the comparators can be varied externally if desired by routing the bias voltage node to the outside of the chip in order to be able to control the bandwidths of comparators. One external control signal can set identical bandwidths on all comparators simultaneously.

Figure 7:
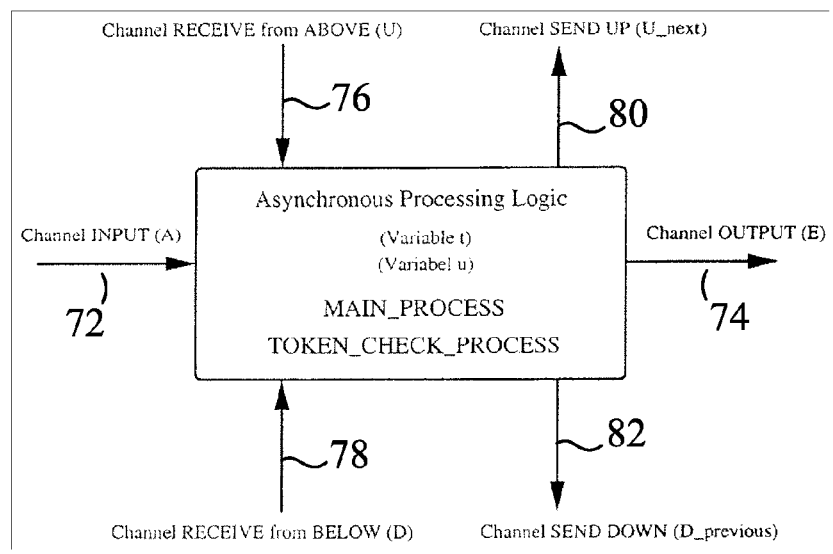
FIG. 7 is a logic block diagram of an asynchronous processing element as used in the embodiment of FIG. 2.

FIG. 7 represents a basic asynchronous processing element 30c. Each processing element 30c has two local variables: u and t. The variable t indicates whether the given element has a token 30t (FIG. 2), which is a logical indicator that the last valid level crossing was processed by this element 30c. Only one processing element 30c can possess the token 30t at any given time, and possession of the token gives the permission to this element 30c to output data. If the token is present, u indicates whether the input signal is above or below the respective reference level of this element 30c. In the case of absence of the token, u indicates whether the token is located above or below this element 30c.

FIG. 7 also shows that each processing element has 5 external channels. Channel "INPUT" 72 represents the signal from the analog comparator after it is processed by a respective trigger. The "OUTPUT" 74 channel is used to output data to the next device, multiplexer 32 (FIG. 2). Channel "RECEIVE from ABOVE" 76 gets activated when the processing element 30b above requests the token, and processing element 30c then passes the token 30t up. Similarly, channel "RECEIVE from BELOW" 78 gets activated when the element 30d below requests the token; the given element 30c then passes the token down. The other two channels "SEND UP" 80 and "SEND DOWN" 82 are used if the given element 30c needs to request the token from the neighboring elements; the adjacent element then passes the token to the given element 30c. At all times, presence of the token represents the last valid level crossing.

By the design of processing circuitry 30, the token cannot skip individual elements. Thus, if a request is obtained by a processing element from its respective trigger and the given element does not have the token, the token is either immediately above or immediately below the given element depending on the value of u.

Figures 8, 9:
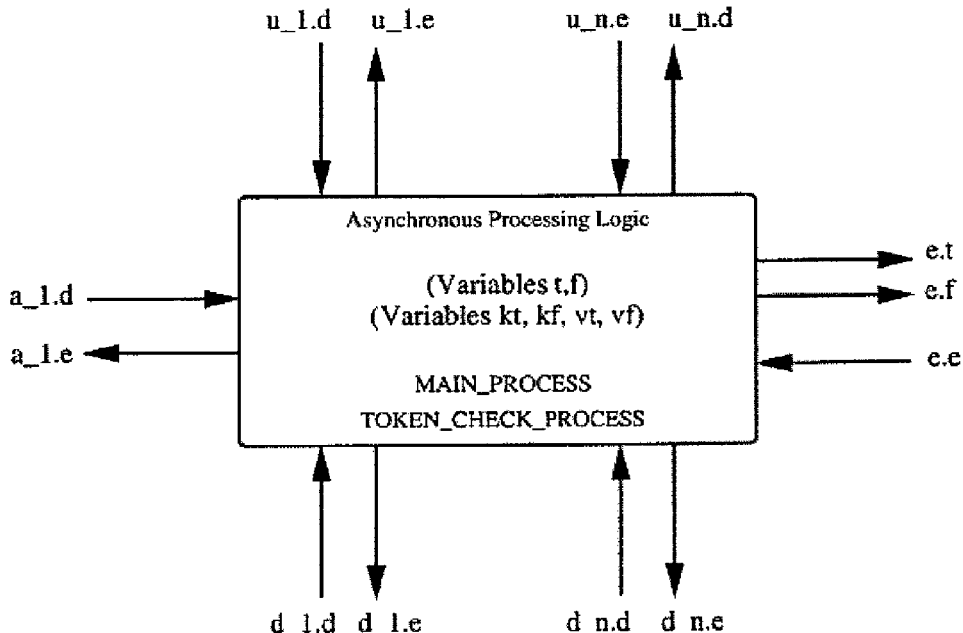
FIG. 8 is a flow chart of a logic process executed by the processing element of FIG. 7.
FIG. 9 is a logic diagram of the handshake channels of the asynchronous processing elements of FIG. 7.

FIG. 8 shows a high-level description of one processing element 30b in CHP notation with the variable legend as follows:
 a. A—request from the trigger
 b. D—request for the token from below
 c. U—request for the token from above
 d. t—variable that is true if the token is present and is false otherwise
 e. k—performs the function of variable u (true if token is above, false if below)
 f. E—output channel that either sends a 1 or a 0 depending on whether the signal crossed the level up or down Each level of the converter 20 starts out in an inactive mode with all variables initialized to predetermined values. Specifically, the t variable is 'false' in all processing elements except the bottom element 30d. In the bottom element 30d, t is initialized to value 'true', since there is only one token in the system. The variable k is initialized to a low value in all processing elements. All communication channels are reset into known states.

There are two processes in FIG. 8 that are executed infinite number of times: TOKEN_CHECK_PROCESS and MAIN_PROCESS. The MAIN_PROCESS performs a deterministic selection between the input probes, which can only become true one at a time as probes have to be mutually exclusive. As soon as one of the request probes becomes true, one of the following holds: either the trigger indicates that the level was crossed, or the element above requests for the token, or the element below requests for the token.

If the trigger indicates that the level was crossed, the request is generated and TOKEN_CHECK_PROCESS is started to verify the presence of the token on the given level. If the token is not present (t is false), the element sends the request to the neighboring element, immediately above or immediately below the given element depending on the value of k. If k is true—the request is sent up, if k is false the request is sent down. If the token is present (t is true), the execution of the selection is terminated with a skip.

Now that the TOKEN_CHECK_PROCESS is finished, the element "knows" that the token is present on its own level, thus, the value of t becomes true, if it was not true before. At this point, since there is only one token in the system, it is safe to output data, because no other element is outputting data. So the value of ok is sent on the output channel. A value of '1' indicates that the level was crossed up and the value '0' indicates that the level was crossed down. This bit assignment is identical to sending the value of ¬,k.

After the output is sent, the value of k is inverted, indicating that the signal has crossed the threshold in either upward or downward direction, depending on the previous value of k After that action is finished, the handshake on channel A is completed indicating that the element is done processing the input request.

The processing element is now ready for the next request. If the D probe becomes true, the element below the given element is requesting the token. The communication on D is performed right away to speed up the token transfer. The value of t on the element is lowered, indicating that it does not have the token any more. The value of k becomes low indicating that the token is below this level.

If the U probe becomes true, the element above the given element is requesting the token. The communication on U is performed right away to speed up the token transfer. The value of t on the element is lowered, indicating that it does not have the token any more. The value of k becomes high indicating that the token is above this level.

After the high level verification was completed, the handshaking expansions are used to define communication actions between various processes in the program. The 4-phase handshaking expansions were used throughout the design. The passive and active handshakes are presented below:
 Active: request↑; [acknowledge]; request↓;[¬acknowledge]
 Passive: [request]; acknowledge↑; [¬request]; acknowledge↓

The diagram of the processing element with all the specific communication channels is shown FIG. 9. This diagram shows all the requests and acknowledges used in the handshaking expansion.

The complete handshaking expansion for one processing unit is presented in the program of FIG. 10. The standard handshake was completed initially and then it was reshuffled by applying handshake transformations to obtain the final reshuffled version. The reshuffling process is presented in Rajit Manohar. An analysis of reshuffled handshaking expansions. In Proceedings of the 7th Annual International Symposium on Asynchronous Circuits and Systems, Salt Lake City, Utah, March 2001, which is incorporated by reference herein, and in Andrew M. Lines. Pipelined asynchronous circuits. Master's thesis, California Institute of Technology, 1995, also incorporated by reference herein, and will not be described herein.

In the handshaking expansion, as well as in the production rules there is a direct correspondence to the channel and variable names of the original CHP. Several differences are as follows. The communication between the MAIN_PROCESS and TOKEN_CHECK_PROCESS is performed on channel Y. All the channels in the handshake and production rules are represented by lower case letters (with _1 added to the "INPUT" channels), in the CHP the same channels are represented by capital letters. All dual rail variables have .t and .f extensions for 'true' and 'false' rails. All request signals have .d extensions. The acknowledges have .a and .e extensions depending on whether the acknowledge is positive-enabled or negative-enabled. sR and pR represent serial and parallel resets. Variable f is the inverse of variable t. An underbar in front of a variable indicates an inverse of the variable following the underbar. The variable k is replaced with the variables kt and kf; at all times, excluding momentary transitions, kt and kf are inverses of each other (cross-coupled inverse). The variable v (vt and v 1) is a state variable that serves the purpose of obtaining the inverse of k (v is a dual-rail variable). The variable a_1_temp is a temporary variable used to set the acknowledge on channel a_1.

Figure 11:
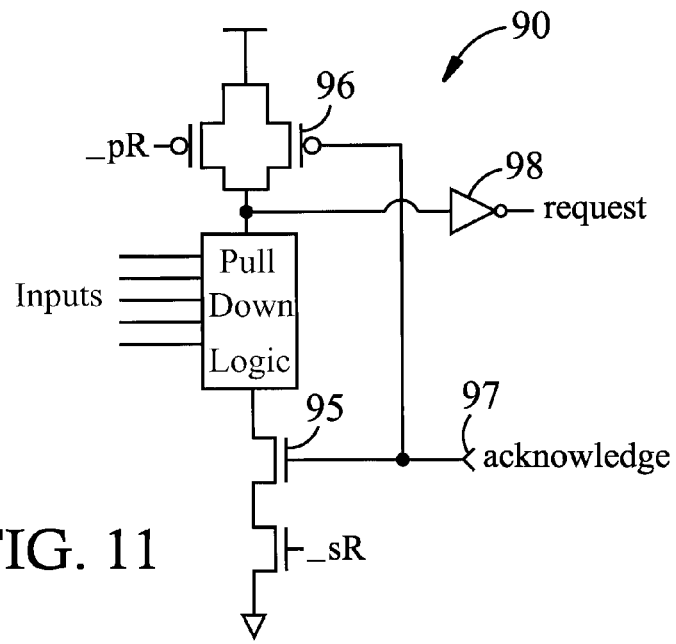
FIG. 11 is a circuit diagram of a digital trigger implementation used in the embodiment of FIG. 2.

FIG. 11 shows a trigger circuit and 90 that wakes up the asynchronous digital processing element. The _sR 92 and the _pR 94 signals are serial and parallel resets, which initialize the trigger in a state, such that no request is produced. The two transistors 95, 96 that have acknowledge 97 connected to their gates indicate that the previous request was properly served. The request 98 signal comes out of the trigger through the inverter 99 since the logic is embedded in the Pull Down Network with NMOS transistors.

Figure 12:
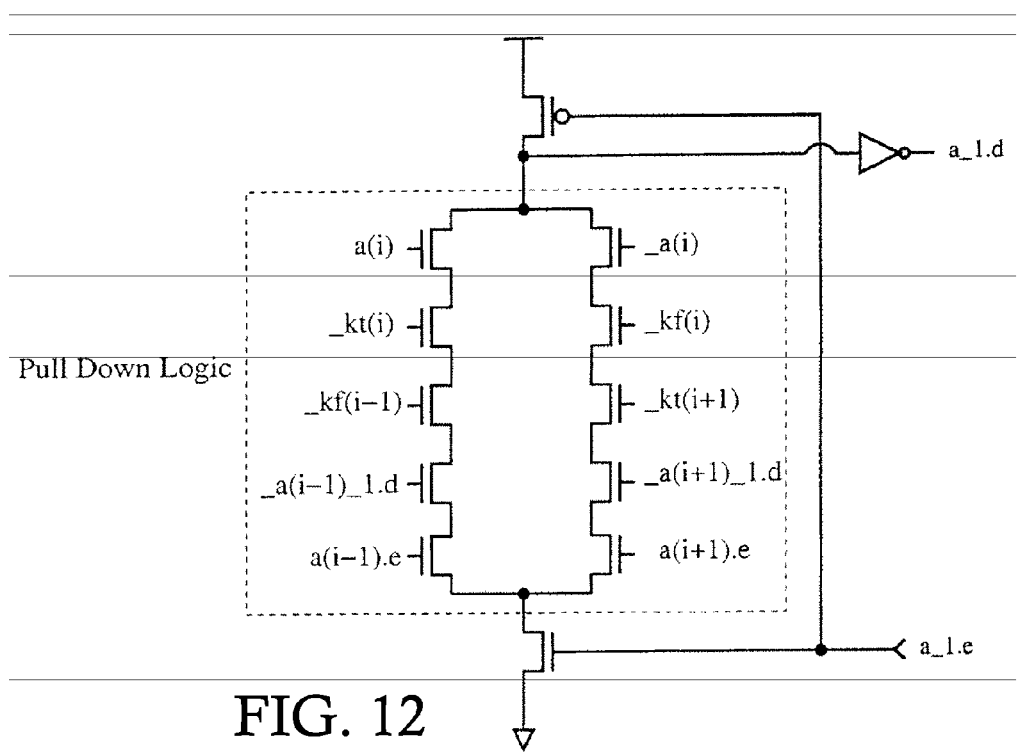
FIG. 12 is a circuit diagram of the pull down a logic portion of FIG. 11.

The internal structure of the trigger is shown in FIG. 12. The _sR and _pR transistors are omitted for clarity. The trigger becomes active if one of the following conditions is satisfied, where i, i−1 and i+1 represent instances of the current, the previous and the next levels, respectively:
  i. If the comparator output is high (a (i) is true) and the current level indicates that the signal was below before (_kt(i) is true) and the previous level indicates that the signal is above (−kf(i−1) is true) and the previous element has completed processing its request and sending its output (_a(i−1)_1.d and a(i−1).e are true);
  ii. If the comparator output is low (_a(i) is true) and this level indicates that the signal was above before (−kf(i) is true) and the next level indicates that the signal is below (_kt(i+1) is true) and the next element has completed processing its request and sending its output (_a(i+1)_1.d and a(i+1).e are true).

The location of the trigger with respect to the asynchronous processing unit is shown in FIG. 2. The output of the trigger is latched by a staticizer, since the output of the comparator can change spontaneously. However, the request to the asynchronous processing element must remain stable, even in the face of a changing analog input signal. The request stays active until the processing unit finishes serving that request.

Once the trigger sends the request to the processing element, the request is considered to be served when the output of the processing elements is sent to the environment. The request is then cleared automatically by the acknowledge 97 signal of the trigger.

The multiplexer 32 of FIG. 2 is implemented in the following way. Since the output channel of each asynchronous processing element is represented by a dual-rail channel E, we need to consider three wires: e.t, e.f and e.a. The 'true' rail is represented by e.t, 'false' rail is e.f, and the acknowledge is e.a. All the outputs are mutually exclusive, as each processing element waits to send its output until the neighboring element is done sending. Thus, at most one element is outputting data at any given time. This means we can safely build an OR tree for all the e.t rails of all elements and another OR tree for all the e.f rails of all elements. In order to have a more efficient circuit, pre charge logic (or active pull-ups) should be used to build the OR trees for the described structure.

Figure 13:
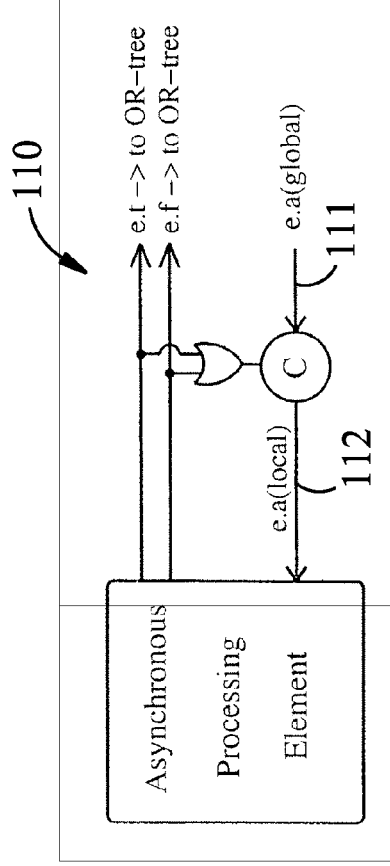
FIG. 13 is a logic schematic of a portion of the converter of FIG. 2.

However, the acknowledge rail is not as trivial to implement. If e.a channel is simply branched to all processing elements, it can trigger actions in all of the elements, which are undesirable and may lead to improper operation. The scheme in FIG. 13 is used to implement the desired operation for the acknowledge. In this circuit 110, the global acknowledge: e.a(global) 111 is distributed to C-elements of all processing elements. But since the C-element waits for both of its inputs to be the same, only the C-element corresponding to the processing element that was outputting data changes its output, e.a(local) 112, since one of the E-channel rails became high when the data was sent to the environment).

A violation in converter 20 occurs if the input signal is changing faster than the maximum allowable rate of change that the asynchronous circuitry can handle. Specifically, if the rate of requests issued to the asynchronous circuitry is higher than maximum rate. A violation takes place in an aggressive design, where the trigger does not check the states of neighboring elements and the request probes are not guaranteed to be mutually exclusive. Such a circuit will work faster, but it can dead-lock if the maximum request rate is violated. In our design we have used a conservative trigger that avoids the deadlock problem, but is not as robust.

If the violation does occur, one of the asynchronous elements may receive more than one request, i.e. more than one of the following signals may activate simultaneously: input request, request from above, request from below. This condition is not allowed, since it can result in a short circuit or possible metastability. Thus, the situation has to be detected and handled by additional circuitry. One way to handle multiple simultaneous requests is to use an arbiter. However, the high repeated area cost of one three-way arbiter per each reference level discourages the use of mutual exclusion elements. The mutual exclusion elements also increase the power consumption of the converter 20.

Figure 14:
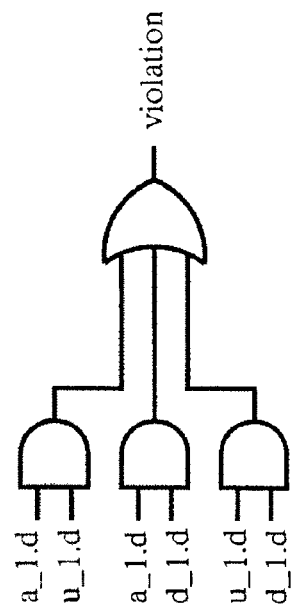
FIG. 14 is a logic schematic of a violation detector which can be used with the converter of FIG. 2.

Instead of using complex additional circuitry to handle the violations, in the embodiment shown below, the violation is detected and the converter 20 is restarted if the violation occurs. We will also signal to the environment that the violation has occurred and that the converter was restarted. In order to do that we have utilized the simple topology depicted in FIG. 14. If more than one request is active simultaneously, maximum allowable frequency of the circuit was exceeded.

As soon as the violation occurs, the circuit is stopped and corrective action is taken. For example, the circuit can be configured to stop and pass control to a microprocessor further down in the processing chain. Another simple solution would be to reset the circuit when the violation occurs. If necessary, resets due to violations may be distinguished from regular user resets using a register. The inputs of the AND gates are all the tuples of a_l, d_1 and u_1 variables that represent the corresponding requests (input, from below and from above). The output of the OR gate resets the converter 20 and signals to the environment that a violation has occurred. On reset, the metastability that resulted from multiple simultaneous requests is eliminated since all the variables are forced to known states, as indicated by the production rules. In order to make the circuit CMOS implementable, the NAND gates should be used instead of OR and AND gates. Two stages of NAND gates would provide functionality identical to that shown in FIG. 14.

As described earlier, this design uses a trigger that does not allow generation of multiple requests to the asynchronous processing element. However, for a more robust design, among the presented solutions to the maximum rate violation problem, the preferred solution is that the lowest power and lowest area solution, which is a simple detector that resets the converter 20, and signals to the user that a violation has occurred.

During the period of inactivity in the input signal, no levels are crossed and thus, the outputs of analog comparators remain constant. The triggers discussed in the previous section send no requests to the asynchronous processing elements since the a(i) and _a(i) inputs to the triggers don't change.

The advantage of our asynchronous digital system is that there is no global clock, so if there is no activity in the input signal, no dynamic or short-circuit power is consumed by any parts of the digital circuits. The asynchronous elements stay in the "idle" mode until the level corresponding to this element is crossed. The only power that is consumed by the asynchronous elements is the leakage power, which heavily depends on the process technology used and increases with decreasing feature size.

In the case of some embodiments of the converter 20, it is more advantageous to use the technology that provides larger feature size (i.e 0.25 μm or 0.18 μm), since the main applications of those embodiments the converter 20 will be in sensor networks and biological implants, where little change is expected over long periods of time and low bandwidth is required. Certainly, this can only be done if area and density are not critical, otherwise, smaller feature size may be used. By manufacturing the converter 20 in a larger feature technology, the source to drain leakage and the gate leakage currents will be minimized and the overall leakage power will also decrease. For those embodiments, 0.25 μm provides a good leakage power vs. area density tradeoff.

In a preferred embodiment, in order to minimize the power consumption of the analog comparators in the period of input signal inactivity, only two comparators are on at any one moment, meaning that the power is supplied to only two comparators.

The two comparators that are enabled are the comparator, whose corresponding asynchronous element has the token, and therefore was outputting data at the last level crossing, and either the comparator that corresponds to the reference level immediately above or immediately below, depending on whether the signal is above or below. If the signal has crossed downwardly or below the given level, the comparator below the token level is enabled, and if the signal has crossed upwardly or is above the given level, the comparator above the token level is enabled.

Figure 15:
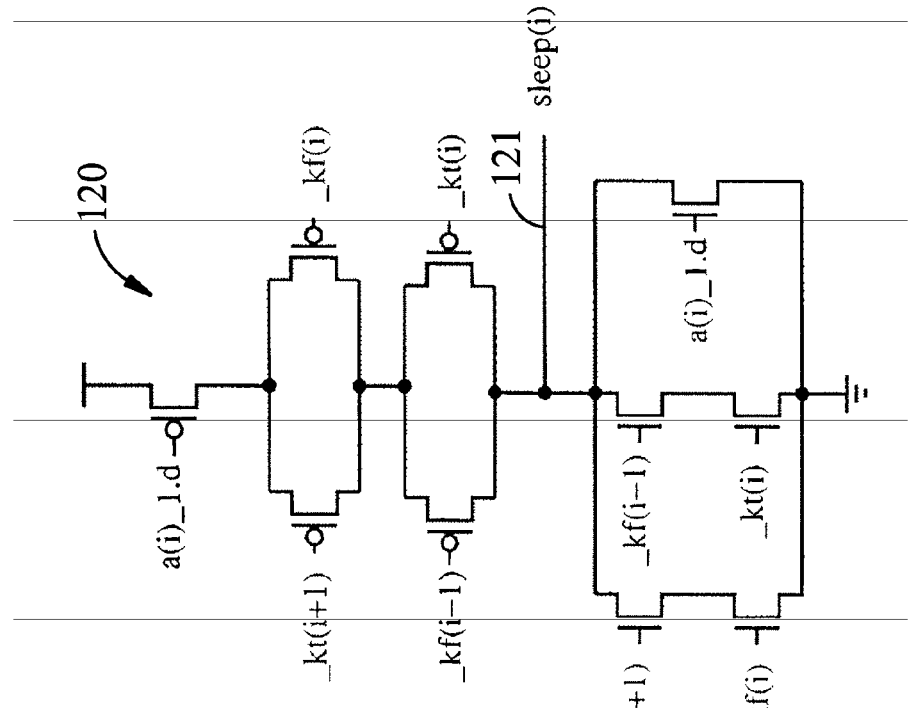
FIG. 15 is a schematic diagram of a control circuit for controlling power to the comparators of converter 20 in FIG. 2.

FIG. 15 shows and implementation of this approach using a circuit 120 that determines whether the comparator's power should be on or off, and additional delay-based digital logic that controls when the power is turned on and off.

The variables used to determine if the comparator's power should be on or off are (i), (i−1) and (i+1), which represent instances of the current, the previous and the next levels, respectively. This circuit generates a sleep signal 121 that is used in the digital logic to control the comparator's positive power supply. The power to the comparator is supplied if one (or more) of the following holds:

i. The signal is above the (i−1) processing element and below this (i) processing element;
ii. The signal is above the (i) processing element and below this (i+1) processing element;
iii. The request is being processed by the current element (indicated by a_l.d) (this condition is needed to avoid a glitch on the comparator's power signal during the period when the values of _kt(i) and −kf(i) are toggling).

Figure 16:
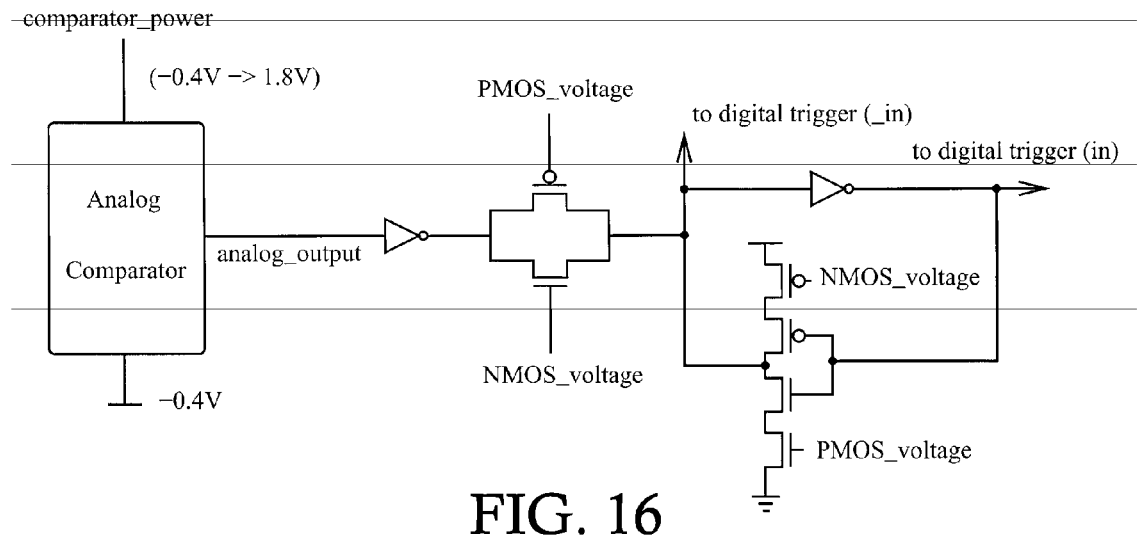
FIG. 16 is a circuit diagram of a comparator output latch.

Thus, if sleep signal is 'true', the power should be cut-off, otherwise the power should be on. The circuit that controls the power to a comparator has to also disconnect the output of the comparator when the power is turned off. This is done because when the power of the comparator is off, the output signal will drop to −0.4 V, the digital trigger can send a false request. In order to avoid that, a pass gate at the output of the comparator does not let any values form the comparator go to the digital trigger when the comparator's power is off. This is shown in FIG. 16. However, when the pass gate disconnects the comparator's output form the trigger, we need to store the last value outputted by the comparator in order to provide correct information to the trigger. This is done by the means shown in FIG. 16. The "staticizer" keeps state only when the pass gate is not conducting. For this reason the signals that open and close the pass gate also control the staticizer's feedback.

The circuit that generates the signals comparatoLpower, PMOS_voltage, and NMOS_voltage shown in FIG. 16 needs to perform several functions. The circuit has to be "edge-sensitive", i.e. behave differently depending on whether the sleep signal changes from '0' to '1', or '1' to '0'.

If the sleep signal was false and becomes true, the first action that takes place is that the pass gate stops conducting the output of the comparator to the digital trigger and the last value of the comparator's output is stored by the staticizer. The next action is that power to the comparator turns off after some delay, so that the correct value is stored in the staticizer. If the sleep signal was true and changes to false, the comparator's power needs to turn on first. After some delay, the transmission gate starts conducting the comparator's output to the digital trigger and the staticizer's feedback is turned off. The delay is required in order to let the comparator's output settle to the correct value before this value is passed to the digital trigger.

Figure 17A:
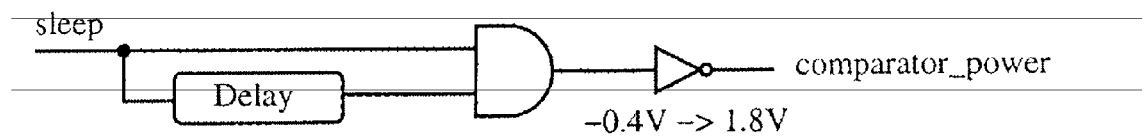
FIGS. 17A and 17B are logic schematics for comparator power management and the converter of FIG. 2.
Figure 17B:
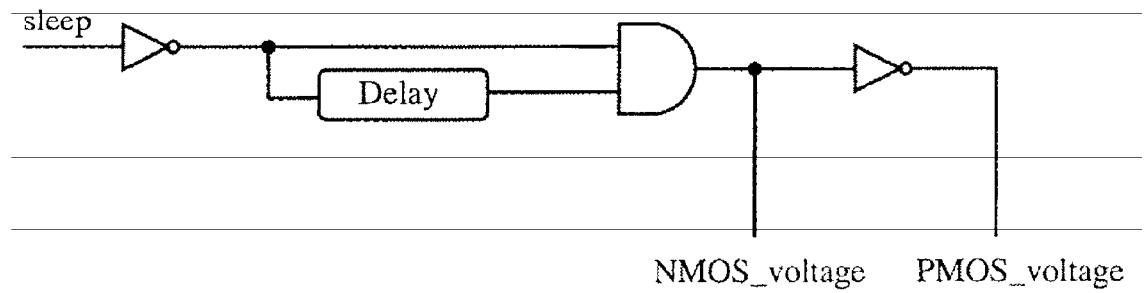

Both of the above scenarios are implemented with the two circuits in FIGS. 17A and 17B. Circuits that perform edge-triggering functions were previously analyzed. The delay may be implemented with a chain of inverters or with an RC circuit. RC delay has an advantage, since the negative plate of the capacitor may be controlled with a voltage source from outside of the chip, which provides variable delay for the circuit. In this case, one additional voltage source sets the same delays for all the reference levels.

For the application of supplying power to the comparators, large transistors with high threshold voltages (power transistors) should be used in order to provide stable sources that can supply sufficient amount of current for the comparator circuits. Also the last gate in the digital logic controlling the comparator's power has to have the swing of −0.4 V to 1.8 V at the output to be able to completely turn off the comparator during the periods of inactivity so that no current is consumed by the circuit.

This method of only powering comparators on either side of the input signal drastically decreases the power consumption of the converter 20. Instead of having all 2n comparators working constantly, we have two comparators powered-up both in the normal mode of operation and in the idle mode. It is due to this fact that we can reduce power consumed by the converter 20 in sleep mode.

The trigger is not consuming any dynamic or short circuit power in idle mode since there is no activity in the input signal. Only the leakage power is of some concern here and can be reduced using the same method as the one used in the asynchronous processing element.

The multiplexer 32 is a purely digital circuit, which does not consume substantially any dynamic or short circuit power in idle mode, since none of its inputs are changing.

The simulations of the comparators show that they can be run in sub-threshold region for minimal power consumption. The average dynamic power consumption with sinusoid input to a single comparator, obtained through simulations is around 5 u W at the frequency of operation in the 10 MHz range with bias voltage at 100 mV. Since the bias voltage of the comparators will be applied from outside of the chip, the bandwidth of the circuit may be increased by increasing the gate voltage on the bias transistor, trading-off bandwidth for lower power consumption. It is however important, while designing the converter 20 to make sure that the comparator has the bandwidth of greater than or at least equal to the speed with which the requests will be processed.

Figures 18A, 18B:
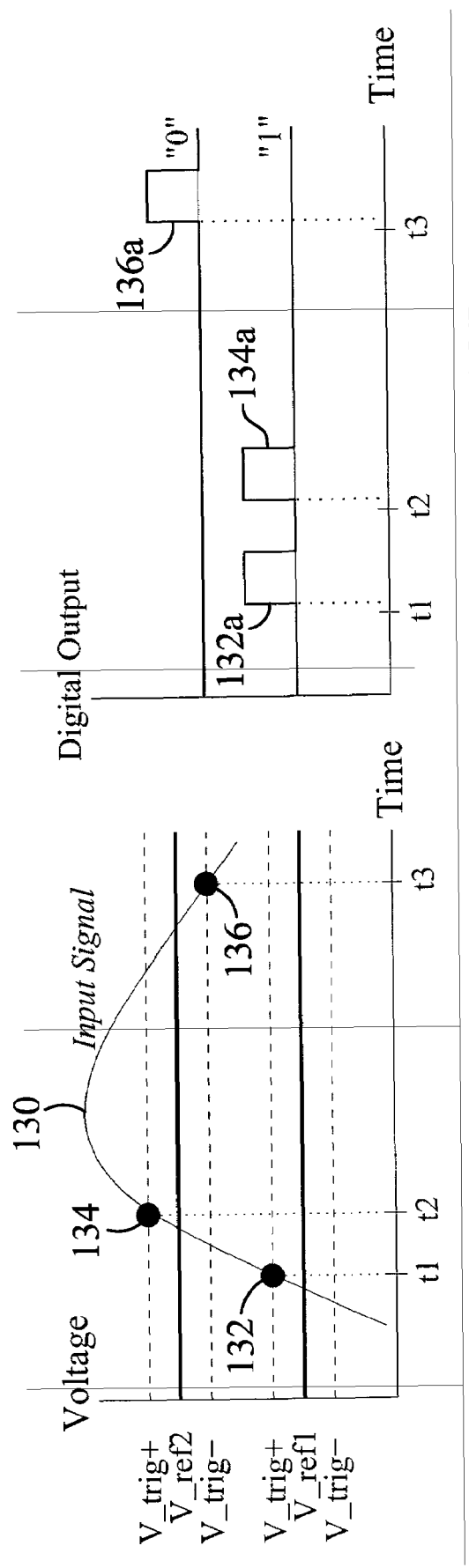
FIGS. 18A and 18B are graphical representations of the operation of the converter of FIG. 2.

FIGS. 18A and 18B are graphical representations of the operation of converter 20. FIG. 18A shows a graph of an input signal 130 varying in voltage over the time frame of the horizontal axis 131. Input signal 130 is compared against to reference levels, Vref1 and Vref2 which each have a hysteresis offset as shown. For this reason, comparators 26 generate output signals when the rising input signal 130 crosses the points 132, 134 and again when the falling input signal 130 crosses the point 136. These crossing points are then outputted by converter 20 as the respective pulses 132a, 134a, 136a as shown in FIG. 18B.

It should be noted that although detailed embodiments have been presented, this invention applies to other embodiments. Although the invention has been described with respect to various embodiments, it should be realized this invention is also capable of a wide variety of further and other embodiments within the spirit of this invention.

What is claimed is:

1. An analog to digital converter for digitally representing the value of an input signal, comprising:
   reference circuitry adapted for simultaneously providing three or more sequential reference values representing a range of values for the input signal;
   a separate comparator representing each different reference value and coupled to receive its respective reference value at a first input thereof,
   wherein each comparator includes a second input coupled to receive the input signal; and
   asynchronous circuitry coupled to the separate comparators and adapted for digitally indicating the value of the input signal in response to level crossings between the input signal and the sequential reference values.

2. The converter of claim 1, further comprising a separate processing circuit coupled to an output of each comparator and adapted for using output signals from each respective comparator to provide a digital representation of level crossings between the input signal and each respective reference value.

3. The converter of claim 2, wherein each processing circuit includes a separate trigger circuit coupled to an output of its respective comparator and adapted to capture changes in the respective comparator output indicating a respective level crossing between the input signal and the respective reference value.

4. The converter of claim 3, wherein each processing circuit is adapted to determine if a change in a respective comparator output is a valid level crossing before providing a digital representation of a level crossing.

5. The converter of claim 4, wherein each processing circuit is adapted to store a logical indicator or token in response to a valid level crossing being determined for its respective comparator output.

6. The converter of claim 5, wherein each processing circuit is adapted to respond to a present signal from its respective trigger circuit indicating a respective present level crossing, to determine if an immediately previous valid level crossing was determined in either the present processing circuit or in processing circuits for respective reference levels located immediately above and below the present respective reference level.

7. The converter of claim 6, wherein each processing circuit is adapted to respond to a present signal from its respective trigger circuit indicating a respective present level crossing, by looking for the logical indicator or token first in the present processing circuit and then in processing circuits for respective reference levels located immediately above and below the present perspective reference level.

8. The converter of claim 6, wherein each processing circuit is adapted to process a present signal from its respective trigger circuit indicating a respective present level crossing as a valid level crossing and output a digital signal representing the level crossing indicated by the respective trigger circuit if an immediately previous valid level crossing was determined in either the present processing circuit or in processing circuits for respective reference levels located immediately above and below the present respective reference level.

9. The converter of claim 2, further comprising control circuitry coupled to said processing circuitry for providing power to only two comparators representing adjacent reference values immediately above and below a current value of the input signal.

10. The converter of claim 1, wherein the asynchronous circuit only provides digital output signals in response to changes in the input signal.

11. The converter of claim 1, wherein the asynchronous circuit only provides digital output signals in response to relative changes between the input signal and each of the reference values.

12. The converter of claim 1, wherein the reference circuitry is a capacitive voltage divider.

13. The converter of claim 1, wherein each comparator exhibits hysteresis.

14. A method for converting an analog input signal to a digital output signal, comprising the steps of:
   simultaneously providing three or more sequential reference values representing a range of values for the input signal;

comparing the input signal to the three or more sequential reference values; and asynchronously processing digital results from the step of comparing to produce a digital representation of level crossings of the input signal with respect to the three or more reference values, in response to each such level crossing.

15. The method of claim 14, wherein the step of comparing is performed using a separate comparator representing each reference level, and further comprising the step of capturing an output signal from each comparator indicating a respective level crossing between the input signal and the respective reference value, for enabling the step of asynchronously processing.

16. The method of claim 15, wherein the step of asynchronously processing is substantially performed by separate logic circuitry respective of each reference level and respective comparator.

17. The method of claim 16, wherein the step of asynchronously processing includes storing a variable indicating which reference level was last crossed by the input signal and whether the input signal is either above or below that last crossed reference level.

18. The method of claim 15, further comprising the step of providing power to only two separate comparators representing reference levels above and below the current input signal value.

19. The method of claim 16, wherein the step of asynchronously processing includes the step of determining if a change in a respective comparator output is a valid level crossing before producing a digital representation of that level crossing.

20. The method of claim 16, wherein the step of asynchronously processing includes the step of determining whether the input signal has crossed a respective reference level from below or from above.

* * * * *